US012578269B2

(12) United States Patent
Oh et al.

(10) Patent No.: US 12,578,269 B2
(45) Date of Patent: Mar. 17, 2026

(54) APPARATUS AND METHOD FOR DETECTING MATERIAL OF VEHICLE BODY PART

(71) Applicants: Hyundai Motor Company, Seoul (KR); Kia Corporation, Seoul (KR); Industry—University Cooperation Foundation Hanyang University ERICA Campus, Ansan-si (KR)

(72) Inventors: Kyuhwan Oh, Ansan-si (KR); Juhyeon Kim, Seoul (KR); Song Jun Lee, Seoul (KR); Hee Sang Kwak, Incheon (KR); Ji Hwan Lee, Ansan-si (KR)

(73) Assignees: Hyundai Motor Company, Seoul (KR); Kia Corporation, Seoul (KR); Industry-University Cooperation Foundation Hanyang University Erica Campus, Ansan-Si (KR)

( * ) Notice: Subject to any disclaimer, the term of this patent is extended or adjusted under 35 U.S.C. 154(b) by 171 days.

(21) Appl. No.: 18/504,665

(22) Filed: Nov. 8, 2023

(65) Prior Publication Data

US 2025/0027877 A1    Jan. 23, 2025

(30) Foreign Application Priority Data

Jul. 21, 2023    (KR) ........................ 10-2023-0095326

(51) Int. Cl.
*G01N 21/3563* (2014.01)
*G01N 21/359* (2014.01)
*G01R 19/165* (2006.01)

(52) U.S. Cl.
CPC ....... *G01N 21/3563* (2013.01); *G01N 21/359* (2013.01); *G01R 19/16571* (2013.01); *G01N 2201/062* (2013.01)

(58) Field of Classification Search
CPC ............. G01N 21/3563; G01N 21/359; G01N 2201/062; G01N 21/8851; G01N 21/8806;
(Continued)

(56) References Cited

U.S. PATENT DOCUMENTS

2001/0055116 A1* 12/2001 Maczura ............... G01J 3/0272
356/326

FOREIGN PATENT DOCUMENTS

KR    20080053993 A    6/2008
KR    20180113832 A    10/2018
(Continued)

*Primary Examiner* — Kiho Kim
(74) *Attorney, Agent, or Firm* — Slater Matsil, LLP

(57) ABSTRACT

An embodiment apparatus for detecting a material of a vehicle body part includes a light source configured to emit an emission light toward the vehicle body part, an optical sensor configured to detect a reflection light generated by reflection of the emission light at the vehicle body part and to generate a detection current according to an intensity of the reflection light, a case enclosing the light source and the optical sensor, and a control circuit configured to convert the detection current to a detection voltage, to determine a material of the vehicle body part as a first material in response to the detection voltage being greater than or equal to a reference voltage, and to determine the material of the vehicle body part as a second material in response to the detection voltage being less than the reference voltage.

18 Claims, 8 Drawing Sheets

(58) Field of Classification Search
CPC ........ G01N 2201/022; G01R 19/16571; G01R
19/16576
See application file for complete search history.

(56) References Cited

FOREIGN PATENT DOCUMENTS

| RU | 2011128433 A | * | 10/2013 | |
|----|--------------|---|---------|------------|
| WO | WO-0109588 A1 | * | 2/2001 | ............ G01N 21/86 |

* cited by examiner

FIG. 1

10 —— | Vehicle body part |

100 ——

110

120

110

| Light source | Optical sensor | Light source |

| Sensing circuit |

130

| Control circuit | — 140

FIG. 3B

APPARATUS AND METHOD FOR DETECTING MATERIAL OF VEHICLE BODY PART

CROSS-REFERENCE TO RELATED APPLICATIONS

This application claims the benefit of Korean Patent Application No. 10-2023-0095326, filed on Jul. 21, 2023, which application is hereby incorporated herein by reference.

TECHNICAL FIELD

The present disclosure relates to an apparatus and method for detecting a material of a vehicle body part.

BACKGROUND

Various panels used in vehicles are manufactured to form an assembly appropriate for the purpose by cutting material coils with a press, loading them by type, transporting them to an assembling (i.e., welding) line, and joining with other types of panels manufactured through the same process. By the way, there are two types of material coils used in panel manufacturing, consisting of a rust-proof material with post-treatment such as coating on the surface and a non-rust-proof material without it.

In order to distinguish rust-proof materials from non-rust-proof materials in the case of mixed production of rust-proof/non-rust-proof materials, only one type of panel is marked using a display device, and the mark is detected using an identifying sensor to distinguish between rust-proof materials and non-rust-proof materials before supplying. Conventionally, a sensor type for directly detecting the presence or absence of a perforated hole was used.

However, in order to add a hole for panel identification, a separate hole-manufacturing mold must be used, and production dualization according to the presence/absence of holes is required. In addition, when movement of the hole position is required due to the necessity of the body line or assembly line, it is difficult, or sometimes impossible, to correct it to respond to the necessity. In addition, in the case that a hole is not normally formed due to damage to a punch or the like, welding with a different type of panel may occur.

In addition, the identification hole is unnecessary after body assembly, but since the hole may act as an inflow path for noise and moisture, post-processing work such as inserting a plug or finishing with a sealer is required to prevent this, and if the processing work is not perfect, the quietness of the vehicle or the rust prevention of the panel is deteriorated. In addition, the identification hole itself could not be formed in the panel forming the outer plate of the vehicle body.

The above information disclosed in this background section is only for enhancement of understanding of the background of embodiments of the disclosure, and therefore it may contain information that does not form the prior art that is already known to a person of ordinary skill in the art.

SUMMARY

The present disclosure relates to an apparatus and method for detecting a material of a vehicle body part. Particular embodiments relate to an apparatus and method for detecting a material of a vehicle body part capable of diversified materials used in a vehicle body part.

Embodiments of the present disclosure provide an apparatus and method for detecting a material specialized for car body parts capable of distinguishing materials of car body parts as rust-proof and non-rust-proof without forming a hole in the car body parts.

An apparatus for detecting a material of a vehicle body part may include a light source configured to emit an emission light toward the vehicle body part, an optical sensor configured to detect a reflection light generated by reflection of the emission light at the vehicle body part and to generate a detection current according to an intensity of the reflection light, a case enclosing the light source and the optical sensor, and a control circuit configured to convert the detection current to a detection voltage, to determine a material of the vehicle body part as a first material when the detection voltage is greater than or equal to a reference voltage, and to determine the material of the vehicle body part as a second material when the detection voltage is smaller than the reference voltage.

The control circuit may be connected to the optical sensor and configured to determine a type of the vehicle body part and vary the reference voltage based on the type of the vehicle body part.

The control circuit may be connected to the light source and may include a display portion configured to display the varied reference voltage and a voltage of the light source.

The control circuit may further include an amplification module configured to convert the detection current to the detection voltage and amplify the converted voltage.

The apparatus for detecting a material of a vehicle body part may further include a barrier disposed between the light source and the optical sensor and configured to prevent the emission light emitted from the light source from being directly detected by the optical sensor.

The barrier has a shape to enclose the optical sensor, the optical sensor may be disposed inside the barrier and the light source is disposed outside the barrier, and the light source may be provided in a plural quantity disposed continuously to surround the barrier.

The optical sensor may be disposed at a right center within the case, and the barrier has a cylinder shape to enclose the optical sensor.

The apparatus for detecting a material of a vehicle body part may further include a sensing circuit disposed under the optical sensor and the light source and electrically connected to the optical sensor and the light source.

The sensing circuit may include a voltage measurement module configured to measure a voltage of the light source.

The case may include a first portion configured to protect an upper portion of the sensing circuit to which the optical sensor and the light source are attached and a second portion configured to protect a lower portion of the sensing circuit, and the first portion may include the barrier.

A ratio between a first height of the barrier and a second height of the first portion of the case may be 1:2.5.

A measurable wavelength of the optical sensor may be 700 nm to 1100 nm.

The light source may include a plurality of infrared LEDs configured to emit light having a wavelength in near-infrared range including 850 nm.

A method for detecting a material of a vehicle body part may include emitting emission light toward the vehicle body part by a light source, detecting a reflection light generated by reflection at the vehicle body part by an optical sensor, generating a detection current according to an intensity of the reflection light, and converting the detection current to a detection voltage by a control circuit, and determining a material of the vehicle body part based on the detection voltage, where the determining the material of the vehicle body part may include determining the material of the vehicle body part as a first material when the detection voltage is greater than or equal to a reference voltage and determining the material of the vehicle body part as a second material when the detection voltage is smaller than the reference voltage by the control circuit.

The method for detecting a material of a vehicle body part may further include measuring a voltage of the light source by a sensing circuit connected to the light source.

The measuring the voltage of the light source may include, when the voltage of the light source is determined as an abnormal state, displaying the abnormal state of the light source through a display portion.

The method for detecting a material of a vehicle body part may further include setting the reference voltage when the voltage of the light source is determined as the normal state.

The setting the reference voltage may include checking proximity of the vehicle body part and setting the reference voltage based on a type of the vehicle body part when the proximity of the vehicle body part is confirmed.

The determining the material of the vehicle body part may further include, when the reference voltage is set, determining a classification mode with respect to the first material or the second material by the control circuit.

The determining the material of the vehicle body part may further include, when the classification mode is determined, recognizing the reflection light by the optical sensor and determining the first material or the second material according to the classification mode by the control circuit.

A measurable wavelength of the optical sensor may be 700 nm to 1100 nm.

According to an apparatus and method for detecting a material of a vehicle body part according to an embodiment, the material of the vehicle body part may be distinguished as rust-proof and non-rust-proof without forming a separate hole in a vehicle body part.

Since an apparatus and method for detecting a material of a vehicle body part according to an embodiment does not form a separate hole in a vehicle body part, it is effective for improving the performance of the vehicle by reducing the noise and increasing the water-tightness of the body.

BRIEF DESCRIPTION OF THE DRAWINGS

FIG. 1 is a block diagram of an apparatus for detecting a material of a vehicle body part according to an embodiment.

FIGS. 3A and 3B are cross-sectional views of an apparatus for detecting a material of a vehicle body part according to an embodiment.

DETAILED DESCRIPTION OF ILLUSTRATIVE EMBODIMENTS

Figure 2:
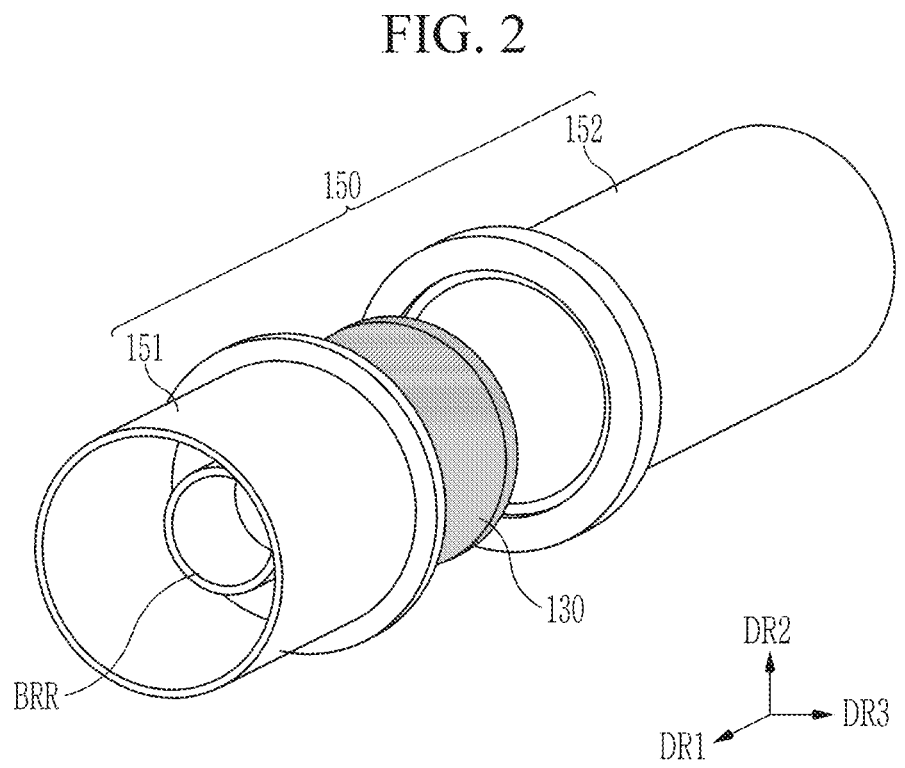
FIG. 2 is an exploded perspective view of an apparatus for detecting a material of a vehicle body part according to an embodiment.

Embodiments of the disclosure will be described more fully hereinafter with reference to the accompanying drawings such that a person of skill in the art may easily implement the embodiments. As those skilled in the art would realize, the described embodiments may be modified in various different ways, all without departing from the spirit or scope of the present invention. In order to clarify embodiments of the present disclosure, parts that are not related to the description will be omitted, and the same elements or equivalents are referred to with the same reference numerals throughout the specification.

In addition, unless explicitly described to the contrary, the word "comprise" and variations such as "comprises" or "comprising" will be understood to imply the inclusion of stated elements but not the exclusion of any other elements. Terms including an ordinary number, such as first and second, are used for describing various constituent elements, but the constituent elements are not limited by the terms. The terms are only used to differentiate one component from other components.

In addition, the terms "unit", "part" or "portion", "-er", and "module" in the specification refer to a unit that processes at least one function or operation, which may be implemented by hardware, software, or a combination of hardware and software.

Hereinafter, embodiments of the present invention will be described with reference to the drawings.

Figure 1:
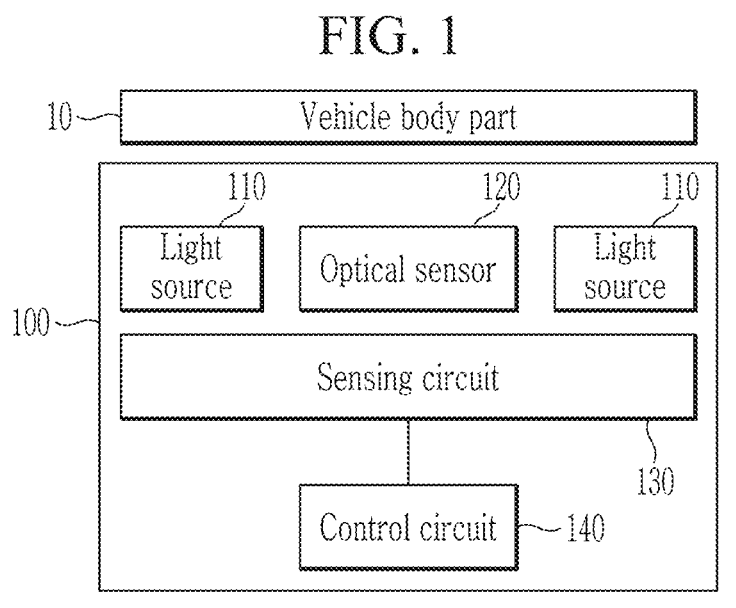

FIG. 1 is a block diagram of an apparatus for detecting a material of a vehicle body part according to an embodiment.

An apparatus 100 for detecting a material of a vehicle body part of FIG. 1 includes components for detecting a material of a nearby vehicle body part 10.

Referring to FIG. 1, the apparatus 100 for detecting a material of the vehicle body part may include a light source 110, an optical sensor 120, a sensing circuit 130 and a control circuit 140.

The light source 110 may emit emission light toward the vehicle body part 10. The light source 110 may be provided in a plural quantity.

The optical sensor 120 may detect reflection light generated by reflection of the emission light at the vehicle body part 10. The optical sensor 120 may generate a detection current according to an intensity of the detected reflection light. The optical sensor 120 may be disposed in the middle of the plurality of light sources 110. The optical sensor 120 may generate the detection current proportional to an amount or intensity of the reflection light. That is, the detection current reflects the amount or intensity of the detected reflection light. The detection current may correspond to a current value generated by detection of the reflection light through the optical sensor 120.

In an embodiment, the optical sensor 120 generates the detection current when the reflection light is received. The control circuit 140 may convert the detection current to a detection voltage. The control circuit 140 may convert the generated voltage to a digital value range of 4096 (=3.3V) (the greater the reflected amount of light, the larger detection current is generated and converted into a larger digital value). For example, the optical sensor 120 may determine the vehicle body part 10 as a first material or a second material based on the converted digital value of the detection voltage. Here, since the digital value is converted from the voltage value, the optical sensor 120 may determine the vehicle body part 10 as the first material or the second material based on the detection voltage value according to the intensity of the reflection light.

The optical sensor 120 may include a photodiode. A range of a measurable wavelength of the optical sensor 120 may be in the range of visible light and near infrared light. The optical sensor 120 may detect the wavelength of 700 nm to 1100 nm.

The sensing circuit 130 may be disposed under the light source 110 and the optical sensor 120 and may be electrically connected to the light source 110 and the optical sensor 120. The sensing circuit 130 may be a PCB to which the light source 110 and the optical sensor 120 are attached.

The control circuit 140 may be connected to the light source 110 and the optical sensor 120 through the sensing circuit 130.

The control circuit 140 may convert the detection current generated by the optical sensor 120 to the detection voltage and may detect the material of the vehicle body part 10 based on the detection voltage. The control circuit 140 may determine the material of the vehicle body part 10 as the first material when the detection according to the intensity of the reflection light detected by the optical sensor 120 voltage is greater than or equal to a reference voltage, and the control circuit 140 may determine the material of the vehicle body part 10 as the second material when the detection according to the intensity of the detected reflection light voltage is smaller than the reference voltage. For example, the control circuit 140 may determine the material of the vehicle body part 10 as a rust-proof material (e.g., zinc-coated) when the detection voltage is lower than the reference voltage and may determine the material of the vehicle body part 10 as a non-rust-proof material (e.g., not zinc-coated) when the detection voltage is higher than the reference voltage.

The control circuit 140 may determine the reference voltage. The control circuit 140 may variably determine the reference voltage according to a type of the vehicle body part 10. For example, the control circuit 140 may determine the reference voltage to be different depending on the vehicle body part 10 is a domestic product or a Chinese product.

FIG. 2 is an exploded perspective view of an apparatus for detecting a material of a vehicle body part according to an embodiment.

Referring to FIG. 2, the apparatus 100 for detecting the material of the vehicle body part may further include a case 150. The case 150 may enclose the light source 110 and the optical sensor 120. The case 150 may interiorly dispose the sensing circuit 130 to which the light source 110 and the optical sensor 120 are attached. The case 150 may protect the interiorly disposed inside sensing circuit 130 from external foreign substance and impacts and external light.

The case 150 may include a first portion 151 and a second portion 152. The first portion 151 and the second portion 152 may be coupled to or separated from each other, interposing the sensing circuit 130 therebetween. The case 150 is shown in a cylindrical shape, but is not limited thereto. The case 150 may also be provided in an angled shape.

The first portion 151 of the case 150 may protect an upper portion of the sensing circuit 130 to which the optical sensor 120 and the light source 110 are attached, and the second portion 152 may protect a lower portion of the sensing circuit 130. Here, the upper portion may be in a first direction DR1, and the lower portion may be in an opposite direction of the first direction DR1. The case 150 may include a material having high abrasion resistance, thermal stability, hardness, and strength required in a working environment. For example, the case 150 may include SUS303 material.

The first portion 151 may include a barrier BRR. The barrier BRR may prevent generation of error that the emission light of the light source 110 except for the reflection light reflected by the vehicle body part 10 (refer to FIG. 1) is detected by the optical sensor 120.

Figure 3A:
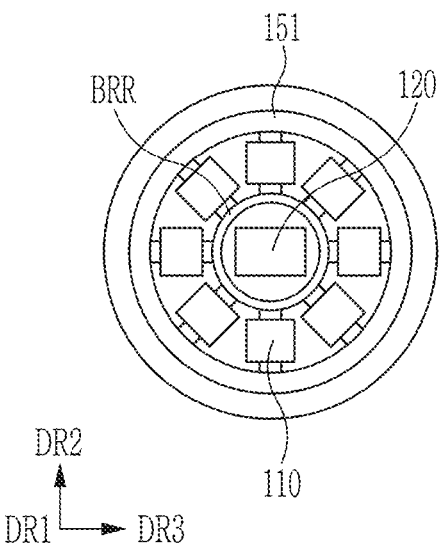
Figure 3B:
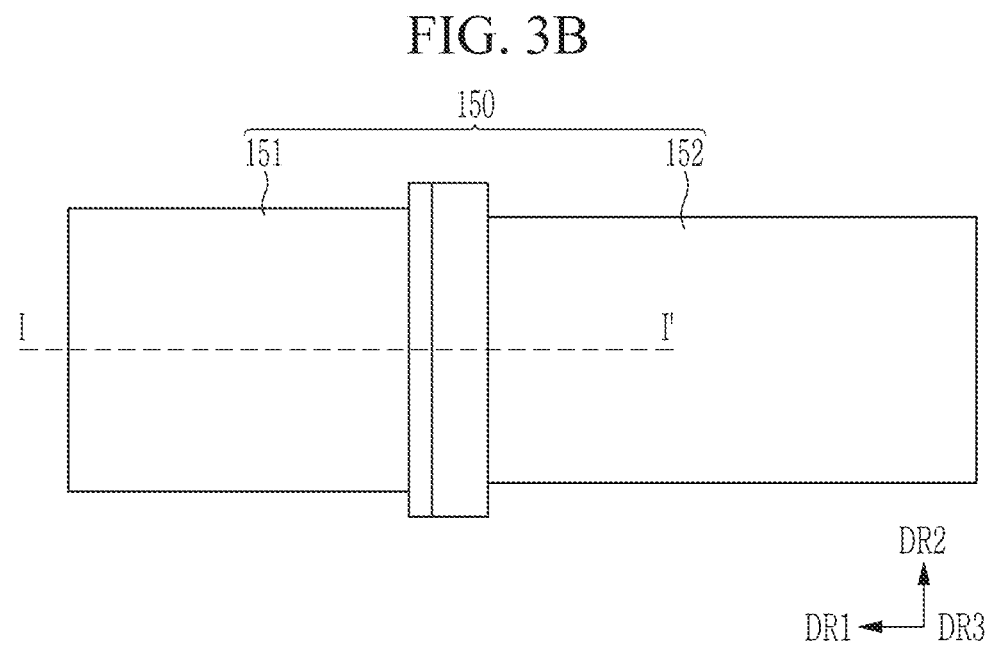

FIGS. 3A and 3B are cross-sectional views of an apparatus for detecting a material of a vehicle body part according to an embodiment. FIG. 3A is a cross-sectional view of the apparatus 100 for detecting the material of the vehicle body part of FIG. 2 when viewed in the first direction DR1. FIG. 3B is a cross-sectional view of the apparatus 100 for detecting the material of the vehicle body part of FIG. 2 when viewed in a third direction DR3.

In FIG. 3A and FIG. 3B, both of the first portion 151 and the second portion 152 of the case 150 are shown to have a cylindrical shape. In FIG. 3A, the barrier BRR may also have a cylindrical shape, like the first portion 151.

The optical sensor 120 may be disposed in an interior (inner side) of the barrier BRR. The barrier BRR may have a form that encloses the optical sensor 120. A plurality of light sources 110 may be disposed in an exterior (outer side) of the barrier BRR. The plurality of light sources 110 may be disposed continuously to surround the barrier BRR. For example, the plurality of light sources 110 may include eight infrared LEDs. The eight infrared LEDs may be densely arranged surrounding the cylindrical barrier BRR. The number of the plurality of light sources 110 may be provided as more than eight depending on a size of the space between the barrier BRR and the case 150.

In order to dispose a maximum number of light sources 110, the barrier BRR may have a cylinder shape, and the optical sensor 120 may be disposed right at a center within the case 150.

Figure 4:
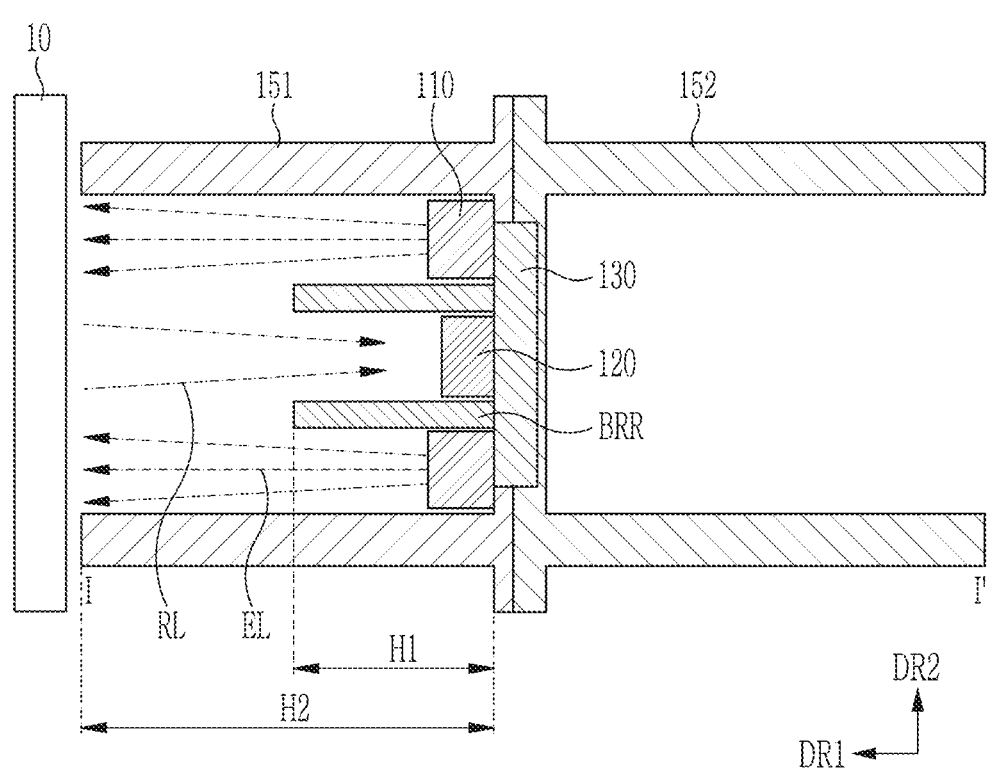
FIG. 4 is a cross-sectional view showing a cross-section taken along line I-I' of FIG. 3B.

FIG. 4 is a cross-sectional view showing a cross-section taken along line I-I' of FIG. 3B. FIG. 4 shows that the emission light EL emitted from the plurality of light sources 110 outside the barrier BRR is reflected by the vehicle body part 10, and the reflection light RL is absorbed by the optical sensor 120.

The light source 110 may include a plurality of infrared LEDs emitting light having a wavelength in a near-infrared range including 850 nm.

The optical sensor 120 may detect a wavelength of 700 nm to 1100 nm. The wavelength of 700 nm to 1100 nm may be a range including a difference of reflection wavelength ranges of the first material and the second material. The optical sensor 120 is disposed in the center of the case 150, which may correspond to a portion where light reflected from the vehicle body part 10 mostly overlaps and is detected.

In FIG. 4, the barrier BRR is disposed between the light sources 110 and the optical sensor 120 to prevent the emission light EL from being directly directed from the light sources 110 to the optical sensor 120.

In an embodiment, a ratio between a first height H1 of the barrier BRR and a second height H2 of the first portion 151 of the case 150 may be 1:2.5. For example, the first height H1 of the barrier BRR may be 6 mm, and the second height H2 of the first portion 151 of the case 150 may be 15 mm. Here, the height may be the length in the first direction DR1. In the ratio of 1:2.5, which is the appropriate ratio of the first height H1 and the second height H2, the difference of reflection efficiencies between distinguished materials of the vehicle body part 10 may be maximized. This may be confirmed through Table 1 below. Table 1 shows data as a result of measuring the reflection light reflected by the rust-proof material and the non-rust-proof material, by variously adjusting the first height H1 and the second height H2.

TABLE 1

| H2 | H1 | Rust-proof material | Non-rust-proof material | Reflection efficiency |
|----|----|----|----|----|
| 5 | 4 | 0.438 V | 0.451 V | 3% |
| 5 | 3 | 0.906 V | 0.942 V | 4% |
| 5 | 2 | 2.243 V | 2.324 V | 4% |
| 10 | 3 | 0.521 V | 0.719 V | 27% |
| 10 | 5 | 0.238 V | 0.314 V | 24% |
| 10 | 7 | 0.137 V | 0.169 V | 19% |
| 10 | 9 | 0.000 V | 0.000 V | 0% |
| 12 | 5 | 0.444 V | 0.641 V | 31% |
| 12 | 6 | 0.295 V | 0.484 V | 39% |
| 12 | 7 | 0.250 V | 0.448 V | 44% |
| 12 | 8 | 0.162 V | 0.258 V | 37% |
| 12 | 9 | 0.053 V | 0.073 V | 27% |
| 15 | 5 | 0.238 V | 0.331 V | 28% |
| 15 | 6 | 0.126 V | 0.234 V | 46% |
| 15 | 7 | 0.125 V | 0.218 V | 43% |
| 15 | 8 | 0.113 V | 0.193 V | 42% |
| 15 | 10 | 0.045 V | 0.067 V | 33% |
| 20 | 15 | 0.020 V | 0.023 V | 11% |
| 20 | 10 | 0.056 V | 0.071 V | 20% |
| 20 | 5 | 0.169 V | 0.218 V | 22% |

Referring to Table 1, the highest reflection efficiency is found at the first height H1 of 6 mm and the second height H2 of 15 mm, of which the ratio is 1:2.5. In addition, as the ratio of the first height H1 and the second height H2 becomes closer to 1:2.5, higher reflection efficiency may be obtained. Here, the reflection efficiency may correspond to a reflection efficiency of non-rust-proof compared to rust-proof. In Table 1, as a case that the ratio of the first height H1 and the second height H2 is 1:2.5, when the first height H1 is 6 mm and the second height H2 is 15 mm, the reflection efficiency is 46%, which is the highest value. In addition, it may be seen that the reflection efficiency is high at a level of 20% to 40% when the ratio of the first height H1 to the second height H2 is relatively close to 1:2.5. As the difference in reflection efficiency between the rust-proof material and the non-rust-proof material increases, there is an advantage in that it is easy to distinguish the material according to the detection voltage sensed for the reflected light.

Figure 5:
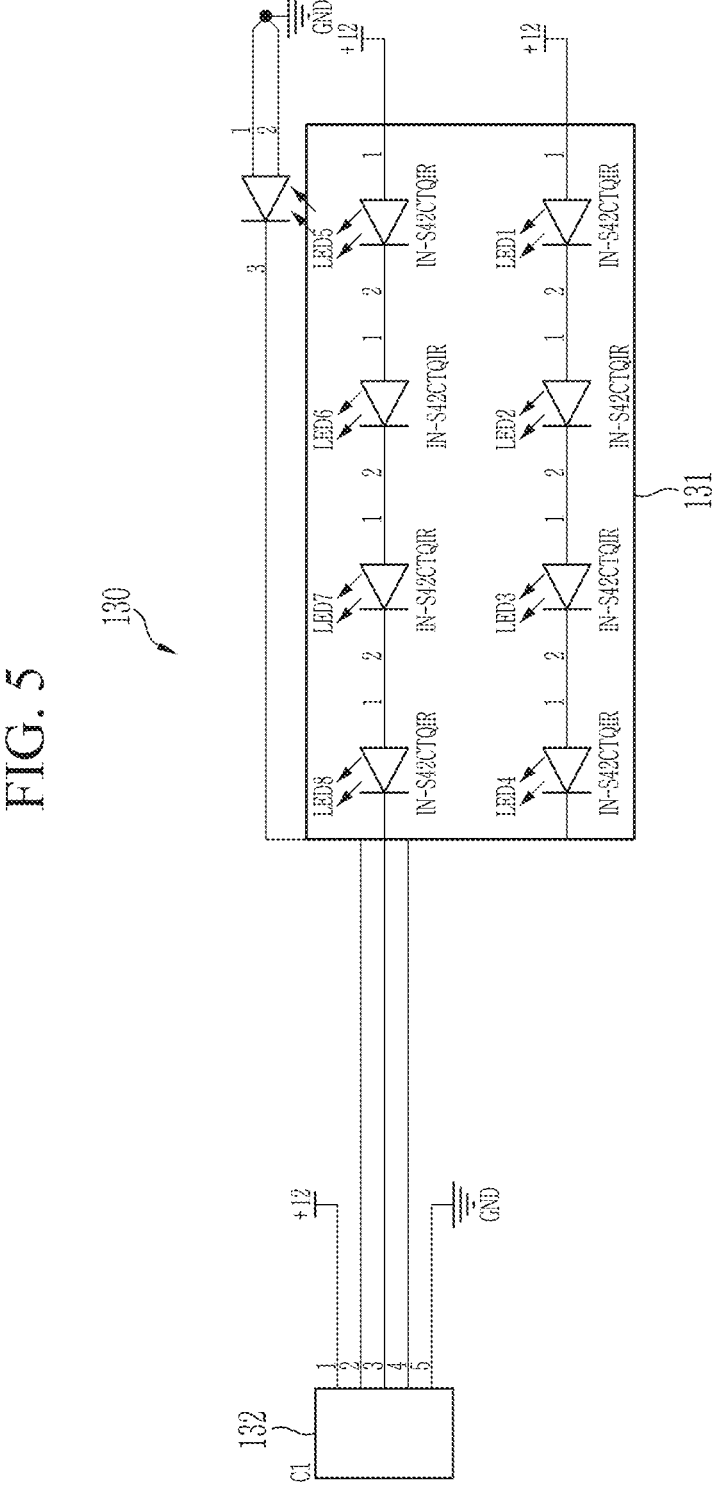
FIG. 5 is a drawing showing a sensing circuit according to an embodiment.

FIG. 5 is a drawing showing a sensing circuit according to an embodiment. Referring to FIG. 5, the sensing circuit 130 may include a plurality of attached LEDs 131 and a voltage measurement module 132 connected to the LEDs 131. The plurality of LEDs 131 may configure the light source 110 of FIG. 1.

The sensing circuit 130 is illustrated as including 8 LEDs 131, but is not limited thereto. In an embodiment, in FIG. 5, four LEDs are set as one set and the voltage of each set is measured. That is, the voltage measurement module 132 may measure the voltage of the two sets of LEDs for each set. The voltage measurement module 132 may measure the voltage of each of the LEDs 131 and determine whether the light source 110 is defective.

Figure 6:
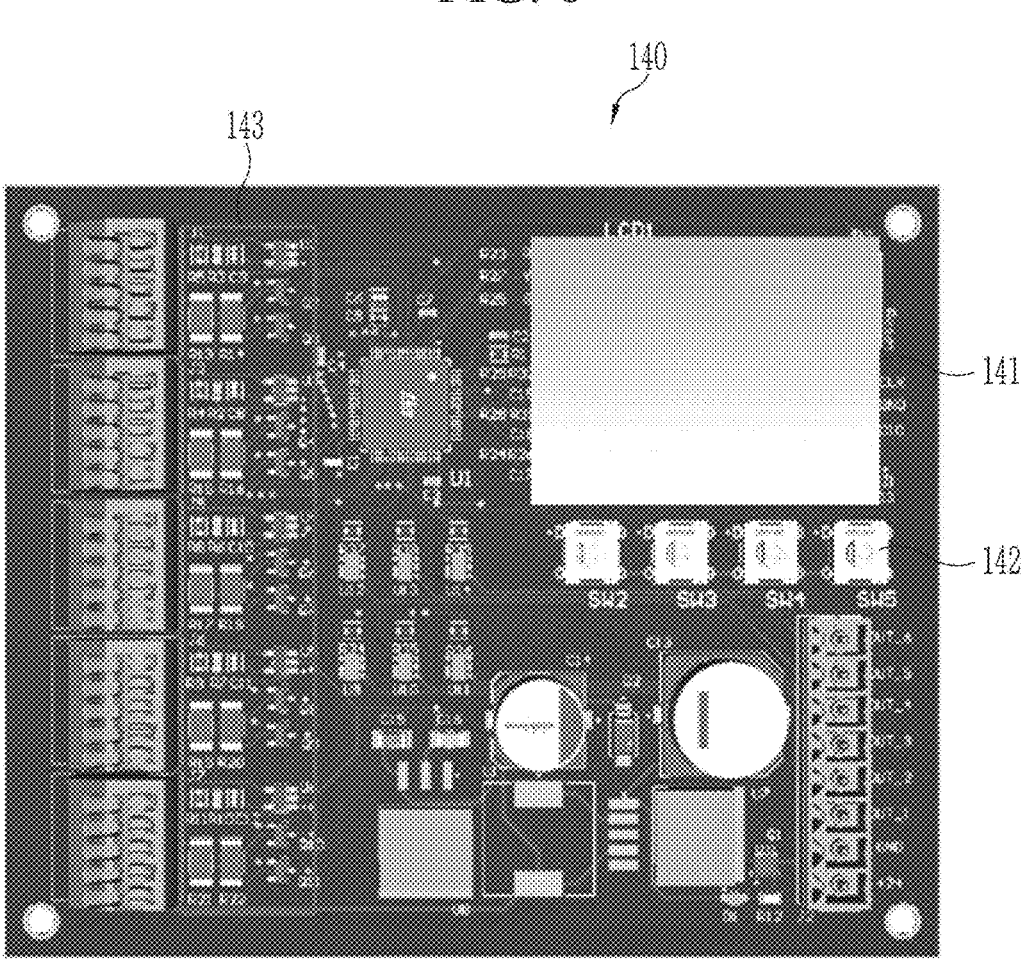
FIG. 6 is a drawing showing a control circuit according to an embodiment.

FIG. 6 is a drawing showing a control circuit according to an embodiment.

Referring to FIG. 6, the control circuit 140 may include a display portion 141, a reference voltage variable module 142, and an amplification module 143.

The control circuit 140 is connected to the optical sensor 120 (refer to FIG. 1) to check the type of the vehicle body part 10 (refer to FIG. 1) and may vary the reference voltage based on the type of the vehicle body part 10.

The display portion 141 may display a voltage of the light source 110 and the reference voltage. The display portion 141 may be provided as a display device configured to display the voltage of the light source 110 and the predetermined reference voltage. The display portion 141 may display a replacement timing together with the voltage of the light source 110. Through the display portion 141, the user may check the measured voltage through the voltage measurement module 132 (refer to FIG. 5). Through the display portion 141, the user may check the varied reference voltage through the reference voltage variable module 142.

The control circuit 140 may vary the reference voltage through the reference voltage variable module 142. In an embodiment, the reference voltage variable module 142 may be provided in a plural quantity. The reference voltage variable modules 142 provided in a plural quantity may be provided for respective types of the vehicle body part 10. The reference voltage variable modules 142 may vary the reference voltage in consideration of wavelength characteristics of the reflection light that varies according to the type of the vehicle body part including a plating characteristic, production environment, or the like of production countries.

The reference voltage variable module 142 checks a plating characteristic of the vehicle body part 10 through the light reflected at the vehicle body part 10, identifies a production country of the vehicle body part 10, and may set the reference voltage to be appropriate for the identified production country. For example, when the production country of the vehicle body part 10 is identified as China, the reference voltage variable module 142 that sets the reference voltage applied to China, among a plurality of the reference voltage variable modules 142, may be selectively turned on.

For example, in the case of the vehicle body part 10 produced in Korea, the non-rust-proof material may have a voltage of 0.684 to 0.966V, and the rust-proof material may have a voltage of 0.12 to 0.273V. In this case, the reference voltage variable module 142 may determine the reference voltage as an appropriate value between approximately 0.273-0.684V.

In the case of the vehicle body part 10 of the Chinese material produced in China, the non-rust-proof material may have a voltage of 0.523-0.805V, and the rust-proof material may have a voltage of 0.12-0.362V. In this case, the reference voltage variable module 142 may determine the reference voltage as an appropriate value between approximately 0.362V-0.523V.

In an embodiment, the reference voltage variable module 142 may be provided as a plurality of adjustment buttons. The reference voltage variable module 142 may be provided as a plurality of buttons, so as to set an appropriate reference voltage according to plating characteristics or the like of the vehicle body part varying depending on the production country of the vehicle body part 10. For example, the plurality of buttons may be buttons to set the reference voltage with respect to vehicle body parts produced in Korea, China, Japan, and the U.S.A., respectively. The user may check the reference voltage displayed through the display portion 141 and vary the reference voltage through the reference voltage variable module 142.

The amplification module 143 converts the fine detection current generated by the optical sensor 120 by reflection of the rust-proof or the non-rust-proof material into the detection voltage. The amplification module 143 may amplify the detection current in the process of converting the detection current into a detection voltage.

Figure 7:
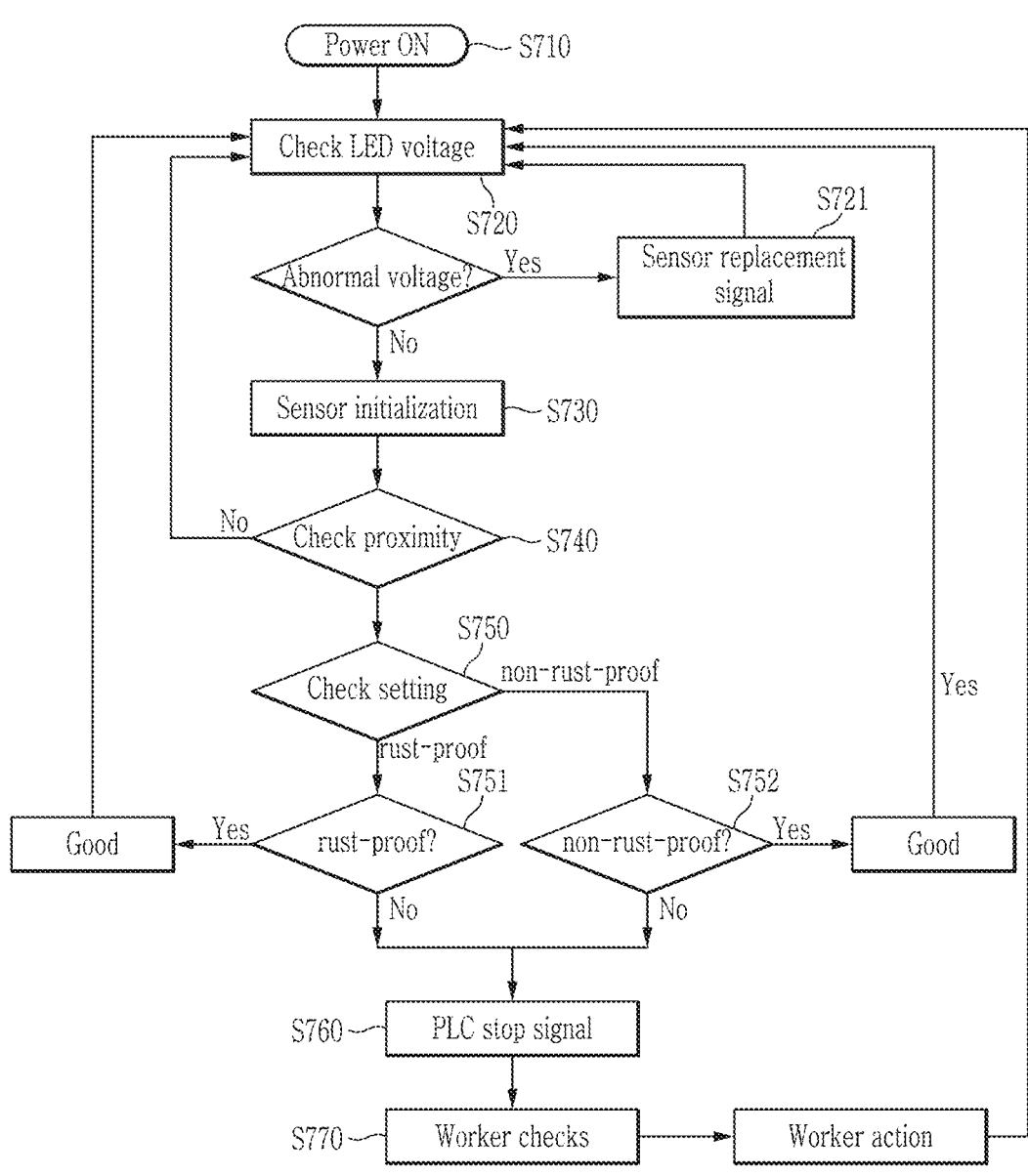
FIG. 7 is a flowchart of a method for detecting a material of a vehicle body part according to an embodiment.

FIG. 7 is a flowchart of a method for detecting a material of a vehicle body part according to an embodiment.

A method for detecting a material of a vehicle body part may include emitting emission light toward the vehicle body part by a light source, detecting a reflection light generated by reflection at the vehicle body part by an optical sensor, generating a detection current according to an intensity of the reflection light, and converting the detection current to a detection voltage by a control circuit, and determining a material of the vehicle body part based on the detection voltage.

The determining the material of the vehicle body part may include determining the material of the vehicle body part as a first material when the detection voltage is greater than or equal to a reference voltage and determining the material of the vehicle body part as a second material when the detection voltage is smaller than the reference voltage by the control circuit.

FIG. 7 shows an overall sensor operation mechanism in which the apparatus 100 for detecting the material of the vehicle body part (refer to FIG. 1) classifies rust-proof materials and non-rust-proof materials. Description will be made with reference to FIG. 1 to FIG. 4.

In FIG. 7, at step S710, the apparatus 100 for detecting the material of the vehicle body part may turn on the optical sensor 120.

At step S720, the apparatus 100 for detecting the material of the vehicle body part may measure voltages of the plurality of LEDs as the light source 110 through the voltage measurement module 132 of the sensing circuit 130. The apparatus 100 for detecting the material of the vehicle body part may display an abnormal state of the light source 110 through the display portion 141 included in the control circuit 140.

At step S721, when the abnormal state is confirmed from a voltage drop, the apparatus 100 for detecting the material of the vehicle body part transmits a replacement signal of the light source LED. For example, the apparatus 100 for detecting the material of the vehicle body part may set the voltage 2.5V±5% of the light source 110 as a normal range. When the voltage is out of the predetermined normal range or when 0V is measured due to disconnection, the apparatus 100 for detecting the material of the vehicle body part may determine the abnormal state of the light source 110.

When the replacement of LEDs is completed, the apparatus 100 for detecting the material of the vehicle body part may check the voltage of the plurality of LEDs to confirm the normal state.

At step S730, when the normal state of the voltage is confirmed, the apparatus 100 for detecting the material of the vehicle body part performs an initialization work of the optical sensor 120. The optical sensor 120 may be set to detect the wavelength of 700 nm to 1100 nm. The apparatus 100 for detecting the material of the vehicle body part may set the reference voltage through the initialization work.

At step S740, the apparatus 100 for detecting the material of the vehicle body part checks whether a measuring target is mounted through a numerical change of the optical sensor 120. That is, the apparatus 100 for detecting the material of the vehicle body part may check proximity of a vehicle body part 10 that is the measuring target based on the reflection light detected by the optical sensor 120. In an embodiment, the apparatus 100 for detecting the material of the vehicle body part may identify the type of the vehicle body part 10 while checking the proximity of the vehicle body part 10 and may automatically set the reference voltage depending on the identified type.

The apparatus 100 for detecting the material of the vehicle body part may detect the detection voltage of the optical sensor and determine it as a rust-proof material when it is lower than the predetermined reference voltage and determine it as the non-rust-proof material when it is higher than the reference voltage.

At step S750, the apparatus 100 for detecting the material of the vehicle body part may set a classification mode for the first material or the second material with respect to the optical sensor 120. For example, the apparatus 100 for detecting the material of the vehicle body part may determine a first classification mode of determining whether the vehicle body part 10 is a rust-proof material or a second classification mode of determining whether the vehicle body part 10 is the non-rust-proof material.

At step S751, the apparatus 100 for detecting the material of the vehicle body part determines the vehicle body part 10 to be a good product if the rust-proof material is confirmed in the first classification mode. At step S752, the apparatus 100 for detecting the material of the vehicle body part determines the vehicle body part 10 to be a good product if the non-rust-proof material is confirmed in the second classification mode.

If neither of the rust-proof material or the non-rust-proof material is confirmed, the apparatus 100 for detecting the material of the vehicle body part sends a stop signal of a programmable logic controller (PLC) at step S760 and may determine at step S770 that a worker's check is required. Thereafter, after a worker's appropriate action, the vehicle body part may be mounted again, and then the apparatus 100 for detecting the material of the vehicle body part may perform again the mechanism of a method for detecting a material of a vehicle body part.

While embodiments of the disclosure have been described in connection with what is presently considered to be practical embodiments, it is to be understood that the embodiments of the disclosure are not limited to the disclosed embodiments, but, on the contrary, are intended to cover various modifications and equivalent arrangements included within the spirit and scope of the appended claims.

What is claimed is:

1. An apparatus for detecting a material of a vehicle body part, the apparatus comprising:

a plurality of light sources configured to emit an emission light toward the vehicle body part;

an optical sensor configured to detect reflection light generated by reflection of the emission light from the vehicle body part and to generate a detection current according to an intensity of the reflection light;

a sensing circuit disposed under and electrically connected to the optical sensor and the light sources, wherein the sensing circuit comprises a voltage measurement module configured to measure a voltage of the light sources and to determine an abnormal state of the voltage of the light sources;

a case enclosing the light sources and the optical sensor;

a control circuit connected to the light sources and comprising a display portion, the control circuit configured to convert the detection current to a detection voltage, to determine a material of the vehicle body part as a first material in response to the detection voltage being greater than or equal to a reference voltage, to display the reference voltage and the voltage of the light sources, display the abnormal state of the light sources in response to the voltage of the light sources being determined as the abnormal state, and to determine the material of the vehicle body part as a second material in response to the detection voltage being less than the reference voltage; and a barrier disposed between the light sources and the optical sensor, wherein the light sources are disposed continuously to surround the barrier and wherein the barrier is configured to prevent the emission light emitted from the light sources from being directly detected by the optical sensor, wherein the barrier has a shape to enclose the optical sensor, and wherein the optical sensor is disposed inside the barrier and the light sources are disposed outside the barrier.

2. The apparatus of claim 1, wherein the control circuit is connected to the optical sensor and is configured to determine a type of the vehicle body part and vary the reference voltage based on the type of the vehicle body part.

3. The apparatus of claim 2, wherein the control circuit further comprises an amplification module configured to convert the detection current to the detection voltage and amplify the detection voltage.

4. The apparatus of claim 1, wherein the optical sensor is disposed at a center region within the case, and wherein the shape of the barrier is a cylindrical shape to enclose the optical sensor.

5. The apparatus of claim 1, wherein:
the case comprises a first portion configured to protect an upper portion of the sensing circuit to which the optical sensor and the light sources are attached and a second portion configured to protect a lower portion of the sensing circuit; and
the first portion comprises the barrier.

6. The apparatus of claim 5, wherein a ratio between a first height of the barrier and a second height of the first portion of the case is 1:2.5.

7. The apparatus of claim 1, wherein a measurable wavelength of the optical sensor is 700 nm to 1100 nm.

8. The apparatus of claim 1, wherein the plurality of light sources comprises a plurality of infrared LEDs configured to emit light having a wavelength in near-infrared range including 850 nm.

9. A method for detecting a material of a vehicle body part, the method comprising:
emitting emission light toward the vehicle body part by a light source;
detecting reflection light generated by reflection from the vehicle body part by an optical sensor and generating a detection current according to an intensity of the reflection light;
converting the detection current to a detection voltage by a control circuit and determining the material of the vehicle body part based on the detection voltage by the control circuit, wherein determining the material of the vehicle body part comprises determining the material of the vehicle body part as a first material in response to the detection voltage being greater than or equal to a reference voltage and determining the material of the vehicle body part as a second material in response to the detection voltage being less than the reference voltage; and
measuring a voltage of the light source by a sensing circuit connected to the light source, wherein measuring the voltage of the light source comprises, in response to the voltage of the light source being determined as an abnormal state, displaying the abnormal state of the light source through a display portion.

10. The method of claim 9, further comprising setting reference voltage in response to the voltage of the light source being determined as a normal state.

11. The method of claim 10, wherein setting the reference voltage comprises checking a proximity of the vehicle body part, and setting the reference voltage based on a type of the vehicle body part in response to the proximity of the vehicle body part being confirmed.

12. The method of claim 11, wherein determining the material of the vehicle body part further comprises, in response to the reference voltage being set, determining a classification mode with respect to the first material or the second material by the control circuit.

13. The method of claim 12, wherein determining the material of the vehicle body part further comprises, in response to the classification mode being determined, recognizing the reflection light by the optical sensor and determining the first material or the second material according to the classification mode by the control circuit.

14. The method of claim 9, wherein a measurable wavelength of the optical sensor is 700 nm to 1100 nm.

15. An apparatus for detecting a material of a vehicle body part, the apparatus comprising:
a light source configured to emit an emission light toward the vehicle body part;
an optical sensor configured to detect reflection light generated by reflection of the emission light from the vehicle body part and to generate a detection current according to an intensity of the reflection light;
a case enclosing the light source and the optical sensor;
a control circuit configured to convert the detection current to a detection voltage, to determine a material of the vehicle body part as a first material in response to the detection voltage being greater than or equal to a reference voltage, and to determine the material of the vehicle body part as a second material in response to the detection voltage being less than the reference voltage;
a barrier disposed between the light source and the optical sensor, wherein the barrier is configured to prevent the emission light emitted from the light source from being directly detected by the optical sensor;
a sensing circuit disposed under the optical sensor and the light source and electrically connected to the optical sensor and the light source, wherein the sensing circuit comprises a voltage measurement module configured to measure a voltage of the light source;
wherein the case comprises a first portion configured to protect an upper portion of the sensing circuit to which the optical sensor and the light source are attached and a second portion configured to protect a lower portion of the sensing circuit;
wherein the first portion comprises the barrier; and
wherein a ratio between a first height of the barrier and a second height of the first portion of the case is 1:2.5.

16. The apparatus of claim 15, wherein the control circuit is connected to the optical sensor and is configured to determine a type of the vehicle body part and vary the reference voltage based on the type of the vehicle body part.

17. The apparatus of claim 15, wherein a measurable wavelength of the optical sensor is 700 nm to 1100 nm.

18. The apparatus of claim 15, wherein the light source comprises a plurality of infrared LEDs configured to emit light having a wavelength in near-infrared range including 850 nm.

* * * * *